(12) United States Patent
Tanaka

(10) Patent No.: US 11,069,582 B2
(45) Date of Patent: Jul. 20, 2021

(54) SEMICONDUCTOR MANUFACTURING EQUIPMENT AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 182 days.

(21) Appl. No.: 16/461,995

(22) PCT Filed: Dec. 21, 2016

(86) PCT No.: PCT/JP2016/088158
§ 371 (c)(1),
(2) Date: May 17, 2019

(87) PCT Pub. No.: WO2018/116418
PCT Pub. Date: Jun. 28, 2018

(65) Prior Publication Data
US 2019/0326185 A1 Oct. 24, 2019

(51) Int. Cl.
*H01L 21/66* (2006.01)
*H01L 21/67* (2006.01)

(52) U.S. Cl.
CPC ........ *H01L 22/12* (2013.01); *H01L 21/67253* (2013.01)

(58) Field of Classification Search
CPC .......................... H01L 21/67253; H01L 22/12
See application file for complete search history.

(56) References Cited

U.S. PATENT DOCUMENTS

2011/0274342 A1* 11/2011 Maeda ............... H01L 22/12
382/149
2012/0181452 A1* 7/2012 Trupke ............... H01L 22/12
250/459.1
(Continued)

FOREIGN PATENT DOCUMENTS

| JP | H04-093044 A | 3/1992 |
| JP | 2003-075124 A | 3/2003 |
| JP | 2013-531227 A | 8/2013 |

OTHER PUBLICATIONS

An Office Action mailed by the Japanese Patent Office dated Dec. 3, 2019, which corresponds to Japanese Patent Application No. 2018-557462 and is related to U.S. Appl. No. 16/461,995.
(Continued)

*Primary Examiner* — Seahvosh Nikmanesh
(74) *Attorney, Agent, or Firm* — Studebaker & Brackett PC

(57) ABSTRACT

Semiconductor manufacturing equipment includes a thickness calculation function, the thickness calculation function including a measurement value acquisition unit configured to acquire a plurality of measurement values at different measurement positions of the wafer from a thickness measurement function configured to measure a thickness of the wafer, a histogram data creation unit configured to create histogram data based on the plurality of measurement values, and a grade group extraction unit configured to extract a grade group from the histogram data, the grade group including sequential grades having frequencies equal to or greater than a predetermined frequency, the thickness calculation function further including a representative value calculation unit configured to calculate a representative value of a thickness of a measurement region based on the grades included in the extracted grade group.

16 Claims, 11 Drawing Sheets

(56) References Cited

U.S. PATENT DOCUMENTS

2013/0045663 A1    2/2013  Galletti et al.
2018/0259570 A1*   9/2018  Henley ................. H05B 45/30

OTHER PUBLICATIONS

International Search Report issued in PCT/JP2016/088158; dated Feb. 7, 2017.

* cited by examiner

F I G . 1
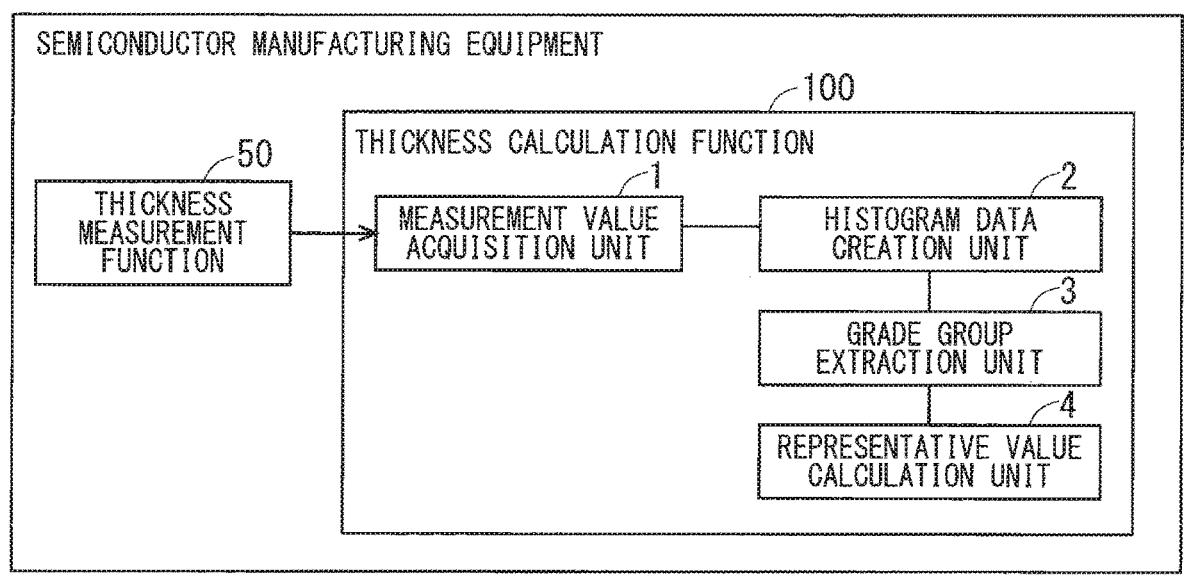
F I G . 2
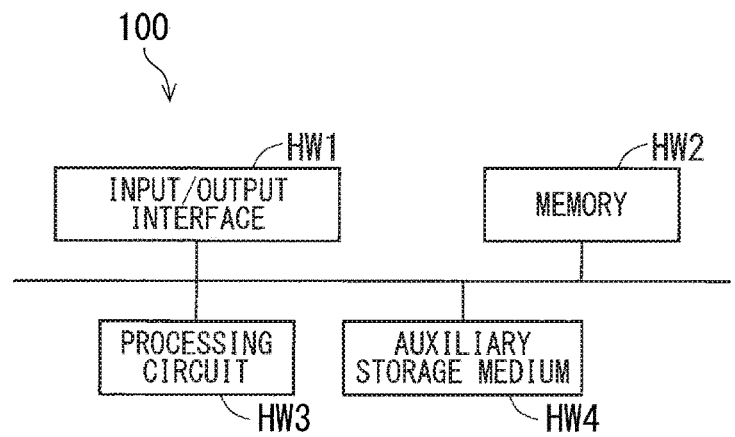

F I G . 3
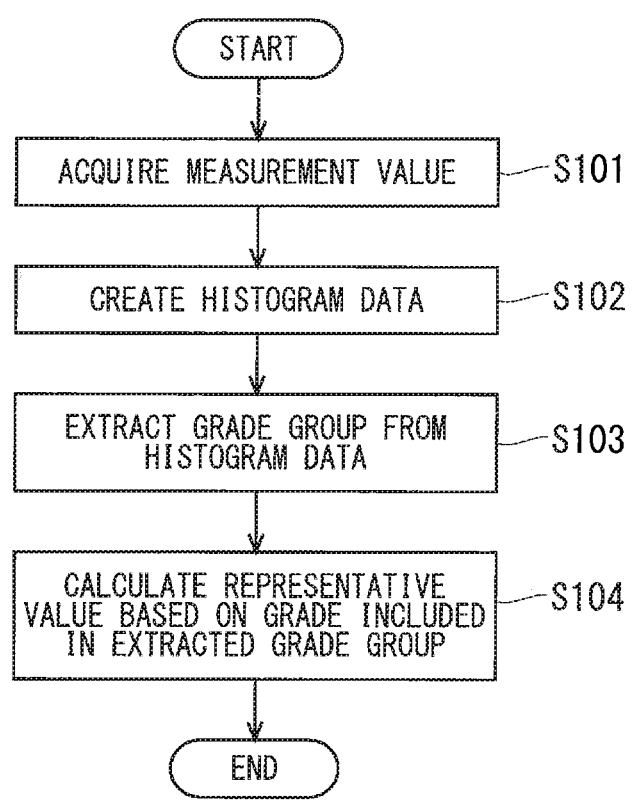

FIG. 6

| GRADE | FREQUENCY | LOWER LIMIT | UPPER LIMIT | MEDIAN |
|---|---|---|---|---|
| 80.4 | 2 | 80.2< | ≤80.4 | 80.3 |
| 80.2 | 5 | 80.0< | ≤80.2 | 80.1 |
| 80 | 6 | 79.8< | ≤80.0 | 79.9 |
| 79.8 | 5 | 79.6< | ≤79.8 | 79.7 |
| 79.6 | 2 | 79.4< | ≤79.6 | 79.5 |
| 79.4 | 0 | 79.2< | ≤79.4 | 79.3 |
| 79.2 | 0 | 79.0< | ≤79.2 | 79.1 |
| 79 | 0 | 78.8< | ≤79.0 | 78.9 |
| 78.8 | 1 | 78.6< | ≤78.8 | 78.7 |
| 78.6 | 0 | 78.4< | ≤78.6 | 78.5 |
| 78.4 | 0 | 78.2< | ≤78.4 | 78.3 |
| 78.2 | 0 | 78.0< | ≤78.2 | 78.1 |
| 78 | 0 | 77.8< | ≤78.0 | 77.9 |
| 77.8 | 2 | 77.6< | ≤77.8 | 77.7 |
| 77.6 | 0 | 77.4< | ≤77.6 | 77.5 |
| 77.4 | 0 | 77.2< | ≤77.4 | 77.3 |
| 77.2 | 1 | 77.0< | ≤77.2 | 77.1 |
| 77 | 0 | 76.8< | ≤77.0 | 76.9 |
| 76.8 | 1 | 76.6< | ≤76.8 | 76.7 |
| 76.6 | 0 | 76.4< | ≤76.6 | 76.5 |
| 76.4 | 0 | 76.2< | ≤76.4 | 76.3 |
| 76.2 | 1 | 76.0< | ≤76.2 | 76.1 |
| 76 | 0 | 75.8< | ≤76.0 | 75.9 |
| 75.8 | 0 | 75.6< | ≤75.8 | 75.7 |
| 75.6 | 0 | 75.4< | ≤75.6 | 75.5 |
| 75.4 | 0 | 75.2< | ≤75.4 | 75.3 |
| 75.2 | 0 | 75.0< | ≤75.2 | 75.1 |
| 75 | 1 | 74.8< | ≤75.0 | 74.9 |
| 74.8 | 6 | 74.6< | ≤74.8 | 74.7 |
| 74.6 | 7 | 74.4< | ≤74.6 | 74.5 |
| 74.4 | 0 | 74.2< | ≤74.4 | 74.3 |
| 74.2 | 0 | 74.0< | ≤74.2 | 74.1 |

SEMICONDUCTOR MANUFACTURING EQUIPMENT AND SEMICONDUCTOR MANUFACTURING METHOD

TECHNICAL FIELD

In the present specification, "a wafer or a thickness measurement object deposited on a wafer" is simply expressed as "thickness measurement object". The present invention relates to semiconductor manufacturing equipment and a semiconductor manufacturing method, and in particular to semiconductor manufacturing equipment and a semiconductor manufacturing method for calculating the thickness of a thickness measurement object.

BACKGROUND ART

In the manufacturing process of semiconductors, the thickness of the thickness measurement object is measured in order to confirm whether processing such as film deposition, etching and the like has been appropriately performed. As a method for measuring the thickness of the thickness measurement object, for example, a technique using an optical sensor is disclosed (see Patent Document 1). The thickness of the thickness measurement object is measured at a plurality of locations of the thickness measurement object and the representative value of the thickness of a measurement region is calculated based on the measurement values, thereby the thickness of the thickness measurement object can be obtained with more accuracy.

PRIOR ART DOCUMENTS

Patent Documents

[Patent Document 1] Japanese Patent Application Laid-Open No. 2003-075124

SUMMARY

Problem to be Solved by the Invention

Hereinafter, measurement of the thickness of a wafer per se will be described as an example of the thickness measurement object. In the manufacturing process of a semiconductor, in some cases, it is necessary to calculate the thickness in a wafer on which a step such as a plurality of trenches is formed on the wafer surface. In this case, conventionally, for example, the measurement value at the designated coordinate on the wafer is used as the representative value of the thickness of the measurement region. However, when the measurement value at the designated coordinate is the measurement value at the bottom of the trench, the thickness of the wafer surface is not accurately reflected in the representative value.

In addition, conventionally, for example, the average value of all measurement values has been used as the representative value of the thickness of the measurement region. However, the measurement value at the bottom of the trench is included when calculating the average value; therefore, it is not accurately reflected in the thickness from the wafer surface.

In addition, conventionally, for example, a mode value of the measurement values has been used as the representative value of the thickness of the measurement region. However, the mode value may indicate the thickness of the wafer at the bottom of the trench; therefore the mode value is inappropriate to use as the thickness from the wafer surface.

The present invention has been made to solve the above-described problems, and it is therefore an object of the present invention to provide semiconductor manufacturing equipment and a semiconductor manufacturing method, capable of calculating the thickness from a surface of a thickness measurement object with more accuracy even when a step, such as a trench is formed.

Means to Solve the Problem

According to semiconductor manufacturing equipment configured to perform processing for manufacturing a semiconductor on a thickness measurement object includes a thickness calculation function for the thickness measurement object, the thickness calculation function including a measurement value acquisition unit configured to acquire a plurality of measurement values at different measurement positions from a thickness measurement function, a histogram data creation unit configured to create histogram data based on the plurality of measurement values, and a grade group extraction unit configured to extract a grade group from the histogram data, the grade group including sequential grades having frequencies equal to or greater than a predetermined frequency, the thickness calculation function further including a representative value calculation unit configured to calculate a representative value of a thickness of a measurement region based on the grades included in the extracted grade group.

According to a semiconductor manufacturing method configured to perform processing for manufacturing a semiconductor on a thickness measurement object. The semiconductor manufacturing method includes a step of calculating a thickness of the thickness measurement object, the step of calculating a thickness including the steps of (a) acquiring a plurality of measurement values at different measurement positions of the wafer from a thickness measurement function configured to measure a thickness of the wafer or a thickness measurement object deposited on the wafer, (b) creating histogram data based on the plurality of measurement values, and (c) extracting a grade group from the histogram data. The grade group includes sequential grades having frequencies equal to or greater than a predetermined frequency. The step of calculating a thickness including a step of (d) calculating a representative value of a thickness of a measurement region based on the grades included in the extracted grade group.

Effects of the Invention

A grade group is extracted from the histogram data created based on the measurement value, and a representative value of the thickness is calculated, for example, from a grade included in the grade group including the largest grade having frequencies equal to or greater than a predetermined frequency; therefore, the representative value of the thickness of a measurement region on the wafer surface can be obtained without being affected by steps such as a trench formed on the wafer surface.

A grade group is extracted from the histogram data created based on the measurement value, and a representative value of the thickness is calculated, for example, from a grade included in the grade group including the largest grade having frequencies equal to or greater than a predetermined frequency; therefore, the representative value of the thickness of a measurement region on the wafer surface can be obtained without being affected by steps such as a trench formed on the wafer surface.

These and other objects, features, aspects and advantages of the present invention will become more apparent from the following detailed description of the present invention when taken in conjunction with the accompanying drawings.

BRIEF DESCRIPTION OF DRAWINGS

FIG. 1 A block diagram illustrating a configuration of a thickness calculation function of semiconductor manufacturing equipment according to Embodiment 1.

FIG. 2 A diagram illustrating a configuration of hardware for the thickness calculation function according to Embodiment 1.

FIG. 3 A flowchart illustrating operation of the thickness calculation function of the semiconductor manufacturing equipment according to Embodiment 1.

FIG. 6 A table summarizing the results of aggregation the measurement values by a histogram data creation unit according to Embodiment 1.

DESCRIPTION OF EMBODIMENTS

Hereinafter, measurement of the thickness of a wafer per se will be described as an example of the thickness measurement object.

Precursor Art

Figure 15:
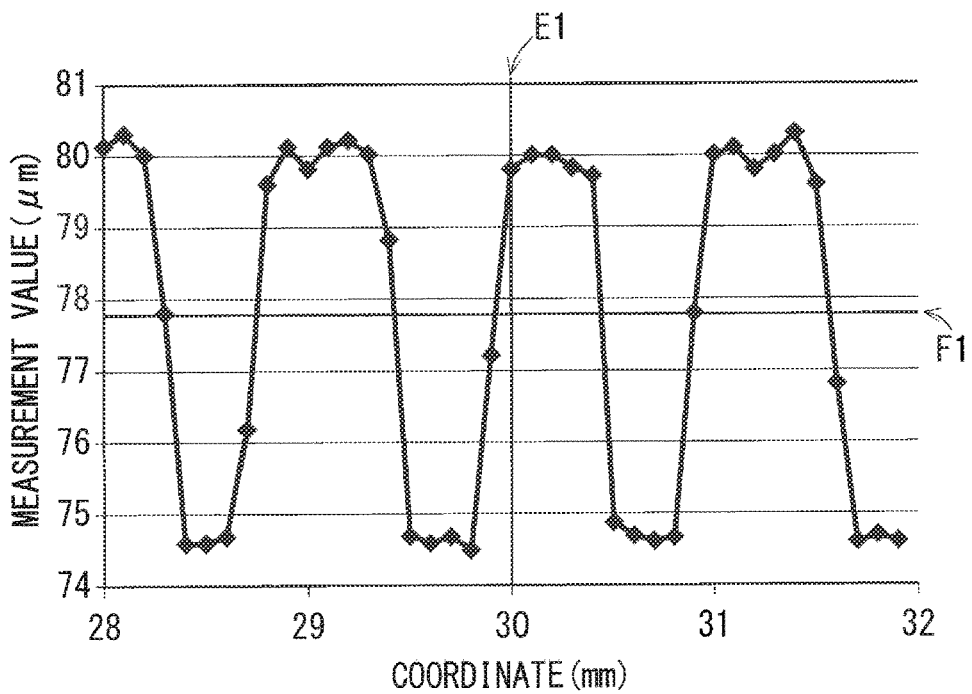
FIG. 15 A graph illustrating measurement values for illustrating a thickness calculation method according to precursor art.

Before describing the embodiment of the present invention, a thickness calculation method for wafer in the precursor art will be described. FIG. 15 is a graph illustrating measurement values for illustrating a thickness calculation method according to precursor art, and FIG. 16 is a graph illustrating a frequency of identical values for illustrating a thickness calculation method according to precursor art shown in FIG. 15.

In FIG. 15, the measurement is performed with sufficiently finer resolution than the width from a wafer surface and a trench portion; therefore, it can be seen that the measurement values indicating the thickness from the wafer surface and the measurement values indicating the thickness of the trench portion are clearly divided into the respective clusters. Meanwhile, the simplest method of obtaining the representative value of the thickness among the conventional techniques of measuring the thickness is a method of setting the measurement value of the designated coordinate as the representative value of the thickness in the measurement region. In FIG. 15, the designated coordinate value E1 (measurement value of the horizontal axis coordinate at 30 mm) is 79.8 μm. In addition, a method of using the average value as the representative value is also widely used, and the average value F1 of the all measurement regions is 77.7 μm. A method in which the mode value is used as the representative value is further included, and as illustrated in FIG. 16, the mode value G1 with the frequency of the highest identical values is 74.6 μm.

Figure 16:
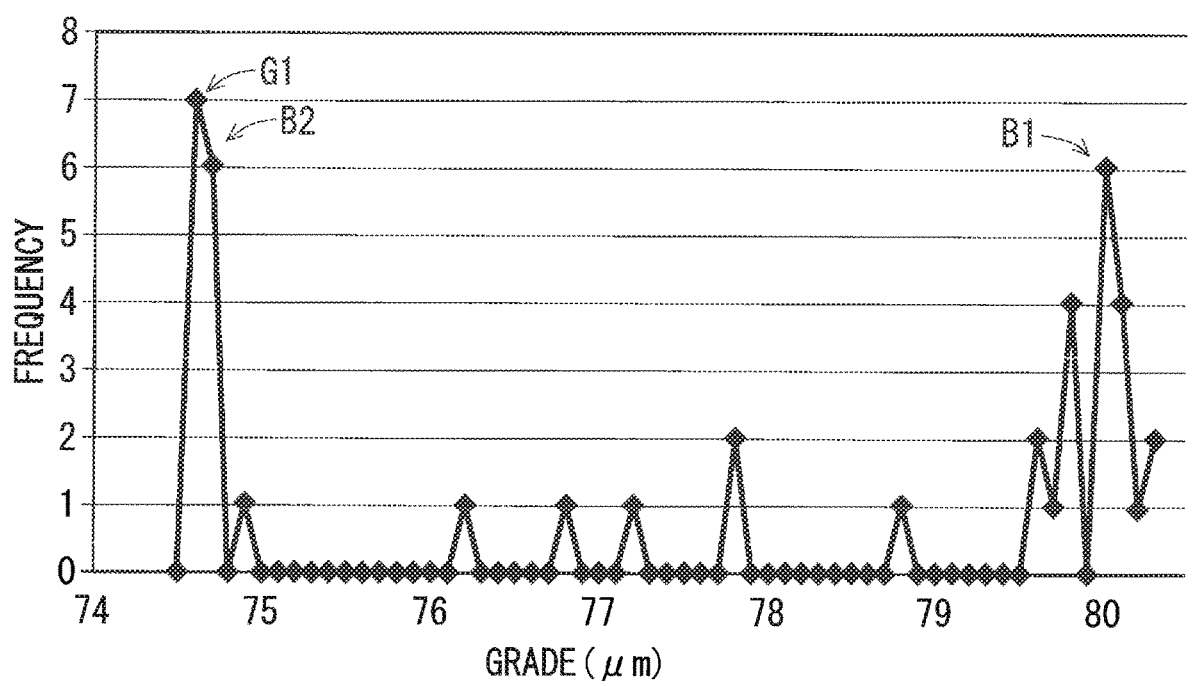
FIG. 16 A graph illustrating a frequency of identical values for illustrating a thickness calculation method according to precursor art.

A problem with the thickness calculation method according to the precursor art is that, when the measurement values are divided into a plurality of clusters such as B1 indicating the wafer surface and B2 indicating the trench portion in FIG. 16, it is undetermined that which of the clusters is used for the calculation of the representative value of the thickness.

In the case of the designated coordinate value E1, either of them may be a representative value depending on how to divide the measurement region, such as when the pitch of the wafer surface or the trench portion does not match the pitch of the designated coordinate.

Further, in the case of the average value F1, the representative value takes a value between the above two clusters B1 and B2, and does not take neither the clusters B1 nor B2.

Also, in the case of the mode value G1, the mode values may appear on both the surface side of the wafer and the side of the trench portion depending on how to divide the measurement region.

As described above, in the precursor art, whether the wafer surface is set as the representative value of the thickness in the measurement region or whether the trench portion is set as the representative value of the thickness of the measurement region is not determined, and this has led to the problem that accurate calculation of the representative value of the thickness is hindered. Embodiments of the present invention described below solve such a problem.

Embodiment 1

Configuration

FIG. 1 is a block diagram illustrating a configuration of a thickness calculation function 100 of semiconductor manufacturing equipment according to Embodiment 1. The semiconductor manufacturing equipment performs a process for manufacturing a semiconductor on a wafer that is a thickness measurement object. Here, the process for manufacturing a semiconductor includes, for example, such processes as deposition and etching. Further, the wafer is, for example, a silicon wafer.

As illustrated in FIG. 1, the semiconductor manufacturing equipment includes a thickness calculation function 100 and a thickness measurement function 50. The thickness calculation function 100 is constituted by a program or a logic circuit including a measurement value acquisition unit 1, a histogram data creation unit 2, a grade group extraction unit 3, and a representative value calculation unit 4.

The measurement value acquisition unit 1 acquires a plurality of measurement values at different measurement positions of the wafer from the thickness measurement function 50 that measures the thickness of the wafer (step of (a) acquiring the measurement value). The histogram data creation unit 2 creates histogram data based on a plurality of measurement values (step of (b) creating histogram data). The grade group extraction unit 3 extracts a grade group from the histogram data (step of (c) extracting a grade group). The representative value calculation unit 4 calculates a representative value of the thickness of the measurement region based on the grades included in the extracted grade group (step of (d) calculating the representative value of the thickness). The grade group will be described later.

FIG. 2 is a diagram illustrating a configuration of hardware for the thickness calculation function 100. The measurement value acquisition unit 1 writes the measurement value transmitted from the thickness measurement function 50 in a memory HW2 via an input/output interface HW1. For example, DRAM, SRAM, FLASH, etc. correspond to the memory HW2.

Processing by the histogram data creation unit 2, the grade group extraction unit 3, and the representative value calculation unit 4 is realized by a processing circuit HW3 and the memory HW2. The processing circuit HW3 may be a dedicated logic circuit or an arithmetic processing integrated circuit such as a Central Processing Unit (CPU) that executes a program stored in the memory HW2.

In the case where the processing circuit HW3 is a dedicated logic circuit, the processing circuit HW3 corresponds to, for example, a logic device, a programmable logic device (PLD), an ASIC, or a combination thereof.

When the processing circuit HW3 is a CPU, the processes of the histogram data creation unit 2, the grade group extraction unit 3, and the representative value calculation unit 4 are described as programs and stored in the auxiliary storage medium HW4. The processing circuit HW3 reads the program stored in the auxiliary storage medium HW4 at the time of activation to the memory HW2 and executes thereof, thereby realizing the processes of the histogram data creation unit 2, the grade group extraction unit 3, and the representative value calculation unit 4. Here, the auxiliary storage medium HW4 is, for example, a nonvolatile semiconductor memory such as FLASH, a magnetic disk, or the like.

It should be noted that, part of the processes of the histogram data creation unit 2, the grade group extraction unit 3, and the representative value calculation unit 4 may be realized by a dedicated logic circuit, and part thereof may be realized by a program.

Operation

Figure 4:
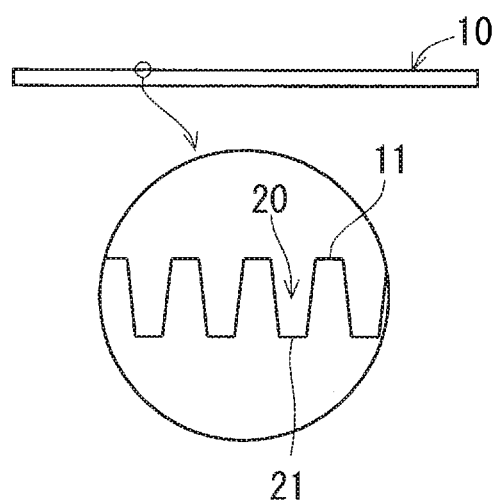
FIG. 4 A diagram illustrating an example of a cross section of a wafer according to Embodiment 1.

FIG. 3 is a flowchart illustrating operation of the thickness calculation function 100 of the semiconductor manufacturing equipment according to Embodiment 1. FIG. 4 is a cross section of a wafer 10 on which a trench 20 is formed by etching in the semiconductor manufacturing equipment of the present embodiment or the semiconductor manufacturing equipment in the pretreatment process. As illustrated in FIG. 4, the trench 20 is formed in the wafer 10; therefore, the thickness of the wafer differs between at the wafer surface 11 and at the bottom 21 of the trench.

Figure 5:
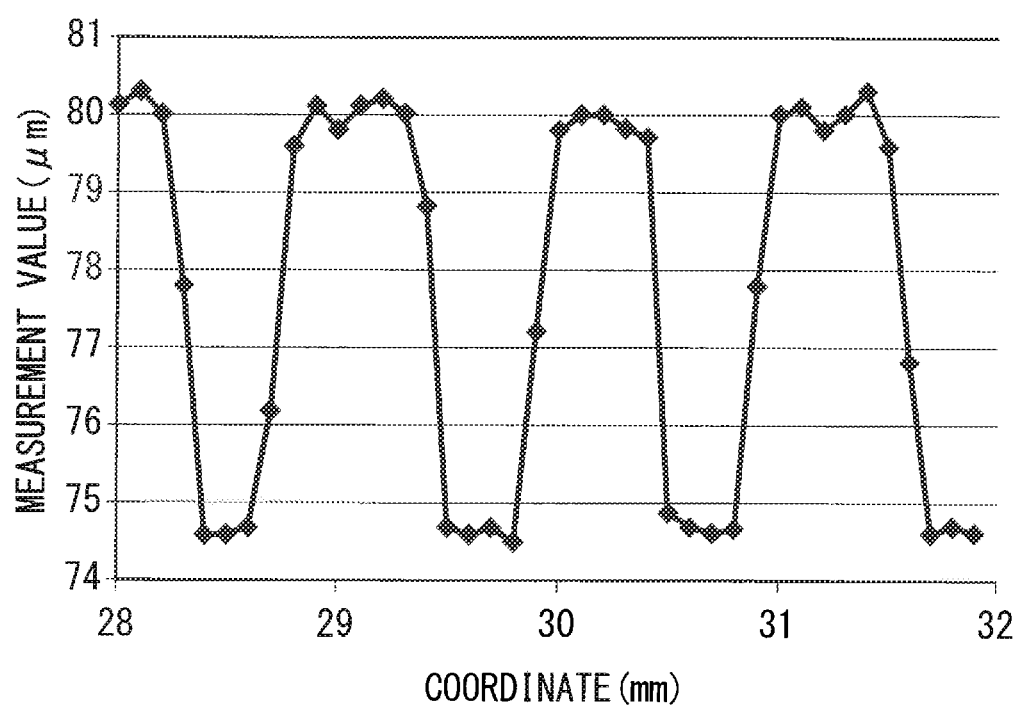
FIG. 5 A graph illustrating measurement values measured by the thickness measurement function according to Embodiment 1.

While the thickness measurement function 50 measures the thickness of the wafer according to a control instruction from the semiconductor manufacturing equipment, the measurement value acquisition unit 1 of the thickness calculation function 100 successively acquires the measurement values via the input/output interface HW1 and saves thereof in the memory HW2 (step S101: step of (a) acquiring the measurement value). FIG. 5 is a graph illustrating measurement values measured at intervals of, for example, 0.1 mm in the diameter direction of the wafer by the thickness measurement function 50.

Next, the histogram data creation unit 2 creates histogram data on the memory HW2 based on the measurement values saved in the memory HW2 (step S102: step of (b) creating histogram data). First, the histogram data creation unit 2 aggregates the measurement values saved in the memory HW2. FIG. 6 is a table summarizing the results of aggregation the measurement values by the histogram data creation unit 2. In FIG. 6, "GRADE" signifies the bin width and "FREQUENCY" signifies the number of measurement values within the range of the corresponding grade. "GRADE" is sectioned every 0.2 μm. For example, the grade of "80.4 μm" is defined as a range greater than 80.2 μm and equal to or less than 80.4 μm. Further, in FIG. 6, "MEDIAN" is defined as a value in the middle of each grade range. For example, the median of "80.4 μm" is 80.3 μm.

Figure 7:
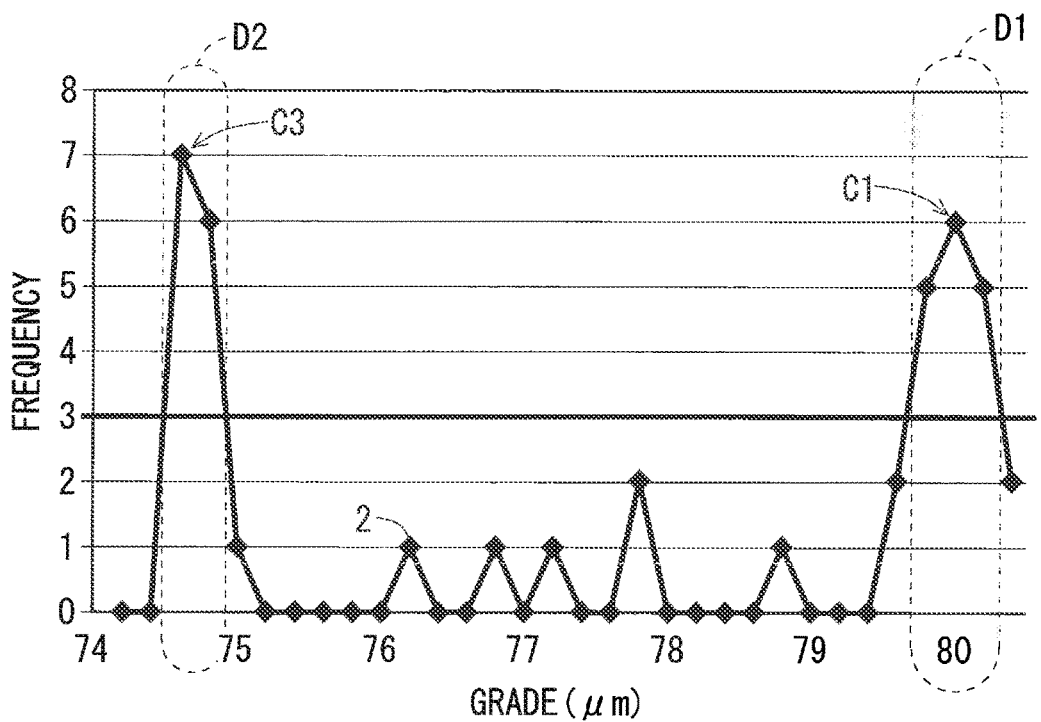
FIG. 7 A graph plotting the histogram data created by the histogram data creation unit according to Embodiment 1.

The histogram data creation unit 2 creates histogram data of the result of aggregation of the measurement values as illustrated in FIG. 6, and saves thereof in the memory HW2. The histogram data indicates, for example, that the memory address indicates a grade and the numerical value saved in the memory of that address indicates the frequency of that grade. FIG. 7 is a graph plotting the histogram data created by the histogram data creation unit 2.

Next, the grade group extraction unit 3 extracts a grade group equal to or higher than a predetermined frequency from the histogram data (step S103: step of (c) extracting a grade group). "Frequency for extraction" is used for grade group extraction. "Frequency for extraction" is a predetermined frequency, and is set to 3 in FIG. 7, for example. The grade group extraction unit 3 extracts the group of the grades as a grade group if grades that are the frequency for extraction or more are in succession while determining whether the frequency for each grade is equal to or more than the frequency for extraction.

As illustrated in FIG. 7, the grade group extraction unit 3 sequentially determines whether the frequency of each grade is equal to or higher than the frequency for extraction in descending order of the higher grades, and the grade group extraction unit 3 extracts sequential grades of "80.2 μm" with a frequency of 6 as the largest grade, "80 μm" with frequency of 6, and "79.8 μm" with a frequency of 5 as one grade group D1. Thereafter, sequential grades of "74.8 μm" with a frequency of 6 and "74.6 μm" with a frequency of 7 as the smallest grade, are extracted as one grade group D2 when necessary.

The frequency for extraction is determined by various methods such as setting the frequency for extraction as a fixed value, setting the extraction frequency as a predetermined ratio of the maximum frequency in the histogram data, and setting the frequency for extraction to a predetermined ratio to the sum of all frequencies. The frequency for extraction is determined in accordance with a determination method suited to the generated histogram data.

As illustrated in FIG. 7, the grade group D1 including the largest grade and the grade group D2 including the smallest grade are clearly separated. The grade group D1 including the largest grade indicates the thickness from the wafer surface. The grade group D2 including the smallest grade indicates the thickness of the wafer at the bottom of the trench formed on the wafer surface.

Next, the representative value calculation unit 4 calculates a representative value of the thickness of the measurement region based on the grades included in the extracted grade groups D1 and D2 (step S104: step of (d) calculating the representative value of the thickness).

It should be noted that, when there are a plurality of measurement regions on the wafer, in order to calculate the representative value of the thickness of each measurement region, the steps from step S101 (step of (a) obtaining the measurement value) to step S104 (step of (d) calculating the representative value of the thickness) are repeated for the number of measurement regions.

In the case where the grade group D1 including the largest grade and the grade group D2 including the smallest grade are clearly separated, it is considered that almost no interference occurs between the grade groups. In this case, the representative value calculation unit 4 can set a frequency distribution average value of the grade group as the representative value of the thickness of the measurement region. Here, the frequency distribution average value of the grade group is a value obtained by dividing the sum of values each obtained by multiplying the median of each grade by the frequency of this grade by the sum of the frequencies included in the grade group.

For example, the frequency distribution average value of the grade group D1 including the largest grade in FIG. 7 is calculated as $(80.1 \times 5 + 79.9 \times 6 + 79.7 \times 5)/(5+6+5) = 79.9$ μm. Similarly, the frequency distribution average value of the grade group D2 including the smallest grade in FIG. 7 is calculated as $(74.7 \times 6 + 74.5 \times 7)/(6+7) = 74.6$ μm. According to this method, the average value is obtained after weighting the frequencies for all the grades of the grade group; therefore, in the case where there almost no interference occurs between the grade groups, a value closer to the true value is obtained.

In this manner, the representative value calculation unit 4 calculates the representative value of the thickness of the measurement region at the wafer surface as 79.9 μm based on the grade included in the grade group D1 including the largest grade. Also, the representative value calculation unit 4 calculates the representative value of the thickness of the measurement region at the bottom of the trench formed on the wafer surface as 74.6 μm based on the grade included in the grade group D2 including the smallest grade.

If the grade group D1 including the largest grade and the grade group D2 including the smallest grade are clearly separated and the frequency distribution of each grade group is close to the normal distribution, in each grade group, the average value of the median of the largest grade and the median of the smallest grade may be used as the representative value. According to this calculation method, the representative value based on the grade included in the grade group D1 including the largest grade in FIG. 7 is calculated as $(80.1+79.7)/2 = 79.9$ μm. Similarly, the representative value based on the grade included in the grade group D2 including the smallest grade in FIG. 7 is calculated as $(74.7+74.5)/2 = 74.6$ μm. According to this method, a value close to the true value can be obtained by a simple calculation.

Further, the depth of the trench can be calculated by subtracting the representative value of the thickness of the measurement region at the bottom of the trench formed on the wafer surface from the representative value of the thickness of the measurement region on the wafer surface.

For ease of explanation, the step S101 (step of (a) acquiring the measurement value) to the step S104 (step of (d) calculating the representative value of the thickness) are sequentially described in order with reference to the flowchart in FIG. 3, however, by processing the step S101 (step of (a) acquiring the measurement value) to step S103 (step of (c) extracting a grade group) in parallel for each measurement region, the calculation load between the measurement regions can be reduced, and measurement of a plurality of measurement regions can be continuously performed. And, when the value of the measurement value becomes equal to or more than "the frequency for extraction", the address of the grade and the memory storing the address of the largest grade and equal to or larger than the "frequency for extraction" are compared with each other, and if it is even larger, then the value is updated, while the address of the grade and the memory stored the address of the smallest grade and equal to or smaller than the "frequency for extraction" are compared with each other, and if it is smaller, then the value is updated. This series of operations is carried out for all measurement values in the measurement region. If there is a value necessary for calculating the representative value separately, such a value is calculated during the operations. Thereafter, the representative value calculation for which the calculation method has already been determined (step S104: step of (d) calculating the representative value of the thickness) is performed. As described above, when calculating based on the grades included in the grade group including the largest grade, the address of the largest grade is extracted from the memory stored the address of the largest grade which is equal to or larger than the "frequency for extraction", and the calculation for calculating the representative value is performed to proceed from the largest grade toward the small grade. Similarly, when calculating based on the grades included in the grade group including the smallest grade, the address of the smallest grade is extracted from the memory stored the address of the smallest grade which is equal to or larger than the "frequency for extraction", and the calculation for calculating the representative value is performed to proceed from the smallest grade toward the large grade. However, this is not the case when each representative value is calculated at the same time. The address of the largest grade is extracted from the memory stored the address of the largest grade which is equal to or larger than the "frequency for extraction". In parallel with this, the address of the smallest grade is extracted from the memory stored the address of the smallest grade which is equal to or larger than the "frequency for extraction". And the calculation for calculating the representative value is performed to proceed from the largest grade toward the small grade and the calculation is ended when it reaches the smallest grade. Conversely, the calculation for calculating the representative value is performed to proceed from the smallest grade toward the large grade and the calculation is ended when it reaches the largest grade.

Effects

As described above, according to the thickness calculation function 100 and the step of calculating the thickness of the wafer in Embodiment 1, the grade group is extracted from the histogram data created based on the measurement value, and the representative value of the thickness of the measurement region is calculated based on the grade included in the grade group. Therefore, the representative value of the thickness of the measurement region can be obtained without being affected by other grade groups.

Further, the depth of the trench can be calculated by subtracting the representative value of the thickness of the measurement region at the bottom of the trench formed on the wafer surface obtained from the grade group D2 including the smallest grade from the representative value of the thickness of the measurement region on the wafer surface obtained from the grade group D1 including the largest grade.

The grade group D1 including the largest grade and the grade group D2 including the smallest grade are clearly separated; therefore, almost no interference occurs between the grade groups. Therefore the representative value calculation unit 4 can take the frequency distribution average value as the representative value of the thickness of the measurement region, and thereby a value even closer to the true value is obtained.

Further, considering that the frequency of each grade group is close to the normal distribution, a value closer to the true value is obtained by a simple calculation by setting the average value of the median of the largest grade and the median of the smallest grade as the representative value.

Embodiment 2

The configuration of the thickness calculation function 100 of the semiconductor manufacturing equipment in Embodiment 2 is the same as that of Embodiment 1 (FIG. 1); therefore, description thereof will be omitted.

Figure 8:
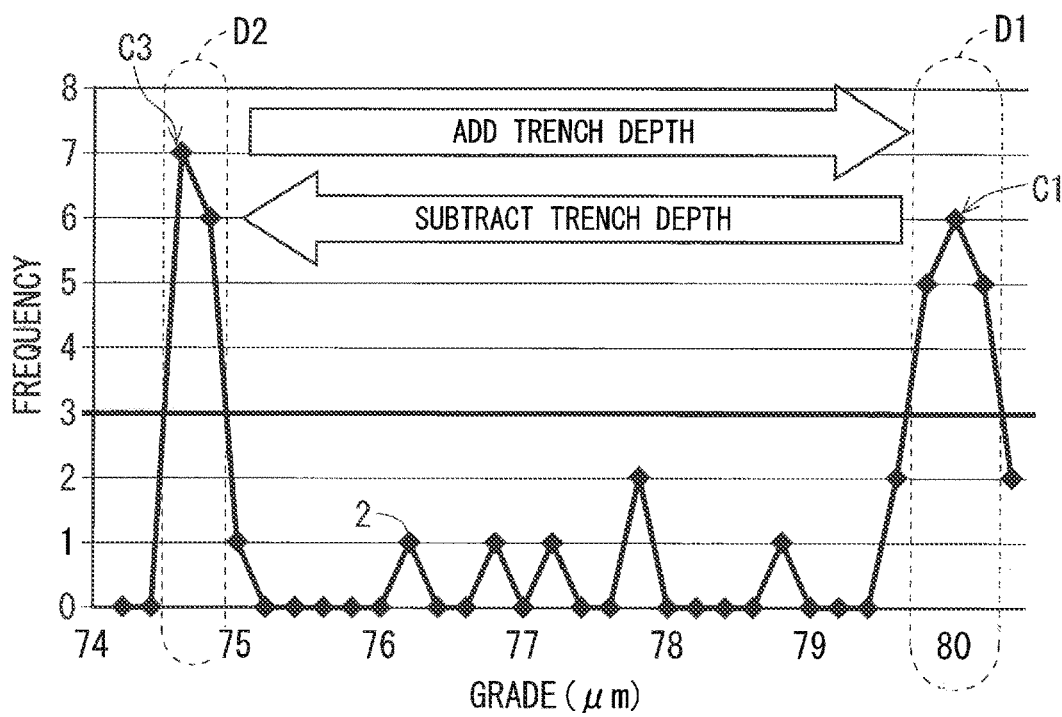
FIG. 8 A graph plotting histogram data for illustrating operation of a representative value calculation unit according to Embodiment 2.

FIG. 8 is a graph plotting histogram data for illustrating operation of a representative value calculation unit 4 according to Embodiment 2. In Embodiment 2, the representative value calculation unit 4 calculates a representative value based on the grades included in the grade group D2 including the smallest grade. And the representative value calculation unit 4 sets a value obtained by adding the value of the trench depth to the representative value as a substitute value of the representative value to be calculated based on a grade included in the grade group D1 including the largest grade.

When the proportion occupied by the trench in the measurement region on the wafer is large, the measurement value indicating the thickness from the wafer surface is small, and the measurement value indicating the thickness of the wafer at the bottom of the trench formed on the wafer surface is increased. That is, in the histogram data, the measurement value indicating the thickness of the wafer at the bottom of the trench may become dominant.

In such a case, as described above, the representative value calculation unit 4 calculates a representative value of the thickness of the measurement region at the bottom of the trench formed on the wafer surface from the grades included in the grade group D2 including the smallest grade. And the representative value calculation unit 4 adds the value of the trench depth to the representative value and sets the value as a substitute value of the representative value of the thickness of the measurement region on the wafer surface.

Further, when the proportion occupied by the trench in the measurement region on the wafer is small, the measurement value indicating the thickness from the wafer surface is large, and the measurement value indicating the thickness of the wafer at the bottom of the trench formed on the wafer surface is decreased. That is, in the histogram data, the measurement value indicating the thickness of the wafer from the wafer surface may become dominant.

In such a case, the representative value calculation unit 4 calculates a representative value of the thickness of the measurement region on the wafer surface from the grades included in the grade group D1 including the largest grade. And the representative value calculation unit 4 subtracts the value of the trench depth from the representative value and sets the value as a substitute value of the representative value of the thickness of the measurement region at the bottom of the trench formed on the wafer surface.

For example, consider dividing the wafer into a plurality of sections, creating histogram data for each section, and calculating a representative value of the thickness of the measurement region on the wafer surface. In this case, the measurement value indicating the thickness of the wafer at the bottom of the trench may become dominant depending on the sections. In this case, in the other section of the wafer, the representative value of the thickness of the measurement region on the wafer surface, the representative value of the thickness of the measurement region at the bottom of the trench formed on the wafer surface, and the depth of the trench are calculated by the method described in Embodiment 1. Then, using the value of the trench depth, a substitute value of the representative value of the thickness of the measurement region on the wafer surface is calculated in the section where the trench is dominant by the method described in Embodiment 2. As a result, the representative value of the thickness of the measurement region on the wafer surface in all the sections on the wafer can be calculated.

Effects

According to the calculation method, even when the measurement value indicating the thickness of the wafer from the wafer surface is dominant in the histogram data created by the histogram data creation unit 2, the thickness of the wafer at the bottom of the trench formed on the wafer surface can be obtained.

Also, even when the measurement value indicating the thickness of the wafer at the bottom of the trench formed on the wafer surface is dominant in the histogram data created by the histogram data creation unit 2, the thickness of the wafer from the wafer surface can be obtained.

Embodiment 3

The configuration of the thickness calculation function 100 of the semiconductor manufacturing equipment in Embodiment 3 is the same as that of Embodiment 1 (FIG. 1); therefore, description thereof will be omitted. In Embodiment 3, the representative value calculation unit 4 sets the median of the grade having the largest frequency as the representative value in the grade group.

In Embodiment 3, in the grade group D1 including the largest grade in FIG. 7, the grade C1 having the largest frequency is 80 μm and the median thereof is 79.9 μm. Accordingly, the representative value based on the grade included in the grade group D1 including the largest grade is 79.9 μm.

In Embodiment 3, in the grade group D2 including the smallest grade in FIG. 7, the grade C3 having the largest frequency is 74.6 μm and the median thereof is 74.5 μm. Accordingly, the representative value based on the grade included in the grade group D2 including the smallest grade is 74.5 μm.

Effects

According to the calculation method, the interference grade has no possibility to be set to the representative value unless there a grade having the largest frequency is included in the interference grade. Therefore, the calculation method is effective in the case where there is some interference between the grade groups.

Embodiment 4

The configuration of the thickness calculation function 100 of the semiconductor manufacturing equipment in Embodiment 4 is the same as that of Embodiment 1 (FIG. 1); therefore, description thereof will be omitted. In Embodiment 4, in the grade group D1 including the largest grade, the representative value calculation unit 4 calculates the median of the grade at the boundary where the frequencies change from increase to decrease from the larger grade side, that is, the frequencies change from 5 to 6 to 5, the grade C1 of the boundary is 80 µm and the median of 79.9 µm is set to the representative value.

Further, in Embodiment 4, in the grade group D2 including the smallest grade, the representative value calculation unit 4 calculates the median of the grade at the boundary where the frequencies change from increase to decrease from the smaller grade side, that is, the frequencies change from 7 to 6, the grade C3 of the boundary is 74.6 µm and the median of 74.5 µm is set to the representative value.

Effects

According to the calculation method, in the grade group D1 including the largest grade, the median of the grade at the boundary where the frequencies change from increase to decrease from the larger grade side is set to the representative value, and in the grade group D2 including the smallest grade, the median of the grade at the boundary where the frequencies change from increase to decrease from the smaller grade is set to the representative value. Therefore, the median of the grade that first appears at the boundary where the change from increase to decrease is set to the representative value. Accordingly, the calculation method calculates the representative value on a grade side where there are even more less interferences than that in the case where the median of the grade having the largest frequency described in Embodiment 3 is set to the representative value. Therefore, the calculation method is effective in the case where there is some interference between the grade groups.

Embodiment 5

Figure 9:
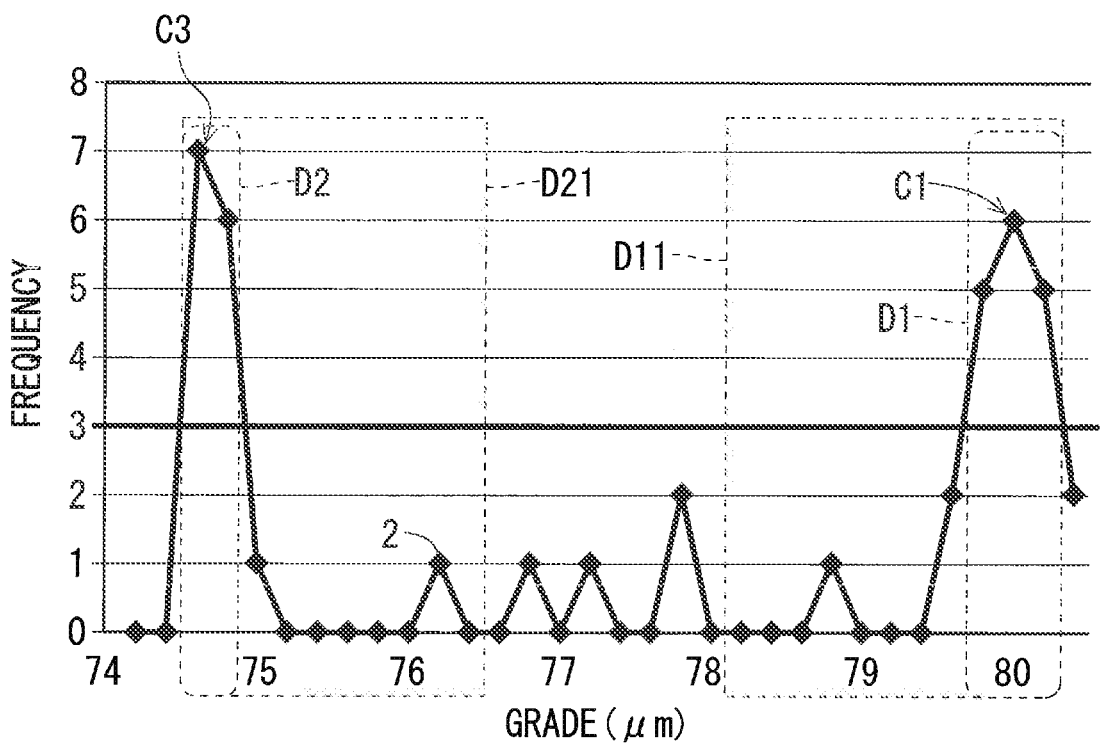
FIG. 9 A graph plotting histogram data for illustrating operation of a representative value calculation unit according to Embodiment 5.

The configuration of the thickness calculation function 100 of the semiconductor manufacturing equipment in Embodiment 5 is the same as that of Embodiment 1 (FIG. 1); therefore, description thereof will be omitted. FIG. 9 is a graph plotting histogram data for illustrating operation of a representative value calculation unit 4 according to Embodiment 5.

As illustrated in FIG. 9, the representative value calculation unit 4 calculates the representative value based on a grade newly set from the largest grade included in the grade group D1 to the smaller grade side, which is included in a grade range D11 that is wide on a grade side smaller than the grade group D1. The representative value is calculated, for example, by the frequency distribution average value described in Embodiment 1 by using the median of each grade. In this case, the representative value based on the grade included in the grade range D11 is calculated as $(80.1 \times 5 + 79.9 \times 6 + 79.7 \times 5 + 79.5 \times 2 + 78.7 \times 1)/(5+6+5+2+1) = 79.8$ µm.

Further, as illustrated in FIG. 9, the representative value calculation unit 4 calculates the representative value based on a grade newly set from the smallest grade included in the grade group D2 to the larger grade side, which is included in a grade range D21 that is wide on a grade side larger than the grade group D2. The representative value is calculated, for example, by the frequency distribution average value described in Embodiment 1 by using the median of each grade. In this case, the representative value based on the grade included in the grade range D21 is calculated as $(74.5 \times 7 + 74.7 \times 6 + 74.9 \times 1 + 76.1 \times 1)/(7+6+1+1) = 74.7$ µm.

Effects

According to the calculation method, the representative value is calculated based on the grade included in the grade range D11 that is wide on the grade side smaller than the grade group D1 including the largest grade; therefore, in the case where there is no interference between the grade groups yet is a long trail, a value even closer to the true value is obtained.

Also, the representative value is calculated based on the grade included in the grade range D21 that is wide on the grade side larger than the grade group D2 including the smallest grade; therefore, in the case where there is no interference between the grade groups yet is a long trail, a value even closer to the true value is obtained.

Embodiment 6

Figure 10:
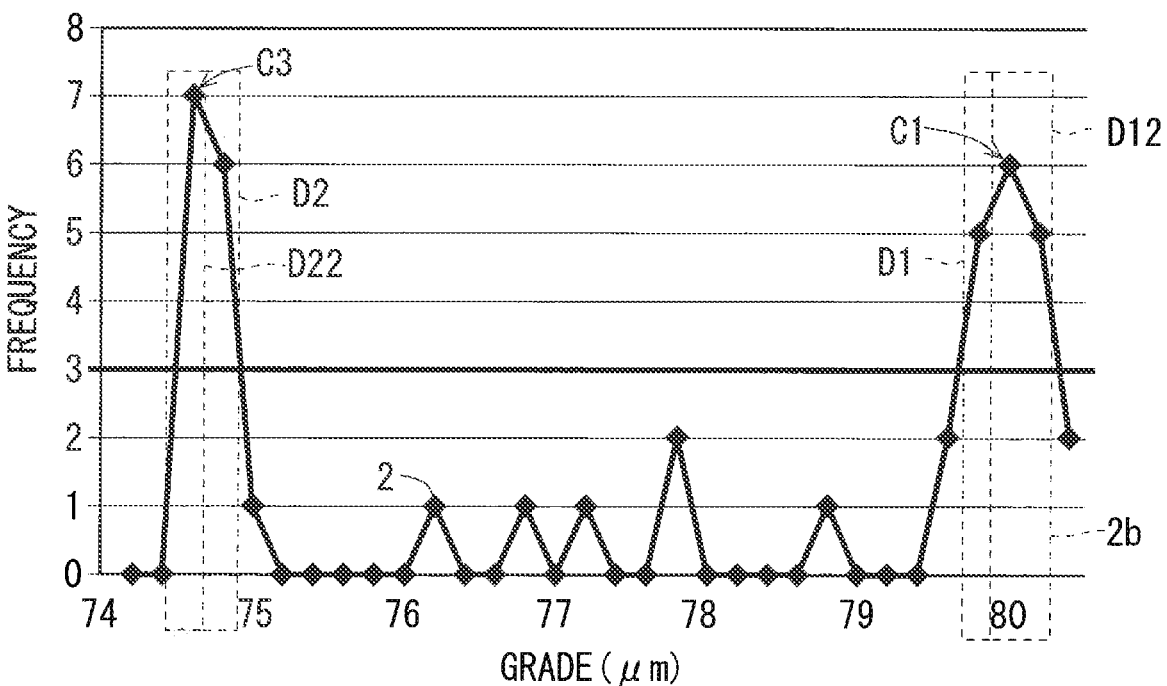
FIG. 10 A graph plotting histogram data for illustrating operation of a representative value calculation unit according to Embodiment 6.

The configuration of the thickness calculation function 100 of the semiconductor manufacturing equipment in Embodiment 6 is the same as that of Embodiment 1 (FIG. 1); therefore, description thereof will be omitted. FIG. 10 is a graph plotting histogram data for illustrating operation of a representative value calculation unit 4 according to Embodiment 6.

As illustrated in FIG. 10, the representative value calculation unit 4 calculates the representative value based on a grade newly set from the largest grade included in the grade group D1 to the smaller grade side, which is included in a grade range D12 that is narrow on a grade side smaller than the grade group D1. The representative value is calculated, for example, by the frequency distribution average value described in Embodiment 1 by using the median of each grade. In this case, the representative value based on the grade included in the grade range D12 is calculated as $(80.1 \times 5 + 79.9 \times 6)/(5+6) = 80.0$ µm.

Further, as illustrated in FIG. 10, the representative value calculation unit 4 calculates the representative value based on a grade newly set from the smallest grade included in the grade group D2 to the larger grade side, which is included in a grade range D22 that is narrow on a grade side larger than the grade group D2. The representative value is calculated, for example, by the frequency distribution average value described in Embodiment 1 by using the median of each grade. In this case, the representative value based on the grade included in the grade range D22 is calculated as $(74.5 \times 7)/7 = 74.5$ µm.

Effects

According to the calculation method, the representative value is calculated based on the grade included in the grade range D12 that is narrow on the grade side smaller than the grade group D1 including the largest grade; therefore, even in the case where there is a wide interference between the grade groups, such an influence by the interference is suppressed by excluding grades of such a range.

Further, the representative value is calculated based on the grade included in the grade range D22 that is narrow on the grade side larger than the grade group D2 including the smallest grade; therefore, even in the case where there is a wide interference between the grade groups, such an influence by the interference is suppressed by excluding grades of such a range.

Embodiment 7

Figure 11:
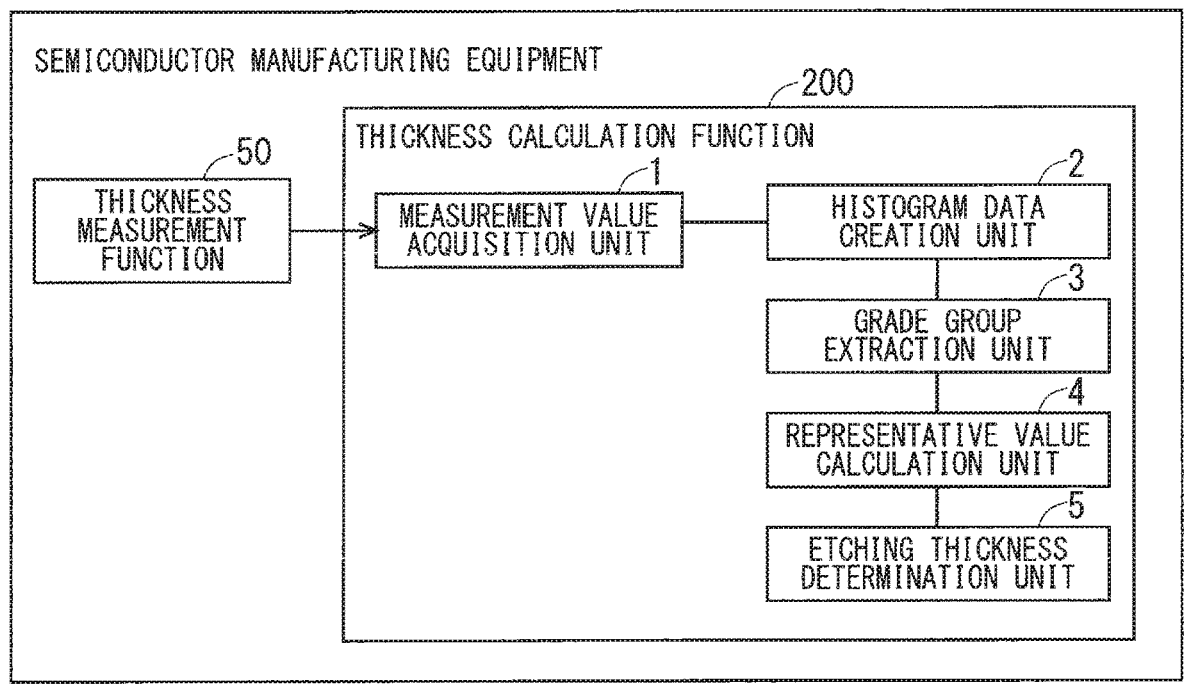
FIG. 11 A block diagram illustrating a configuration of a thickness calculation function of semiconductor manufacturing equipment according to Embodiment 7.

FIG. 11 is a block diagram illustrating a configuration of a thickness calculation function 200 of semiconductor manufacturing equipment according to Embodiment 7. The thickness calculation function 200 according to Embodiment 7 further includes an etching thickness determination unit 5 in contrast to the thickness calculation function 100 (FIG. 1). As described later, the etching thickness determination unit 5 determines whether etching has been performed to a predetermined thickness based on the representative values of the thickness of the measurement range before and after the etching.

Figure 12:
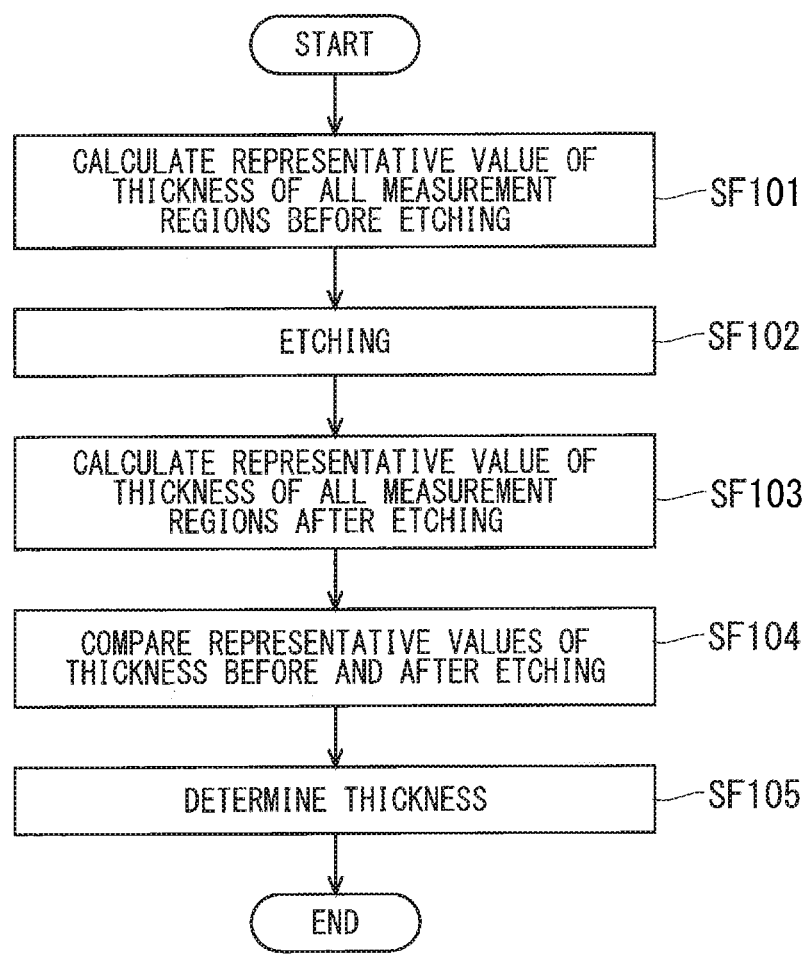
FIG. 12 A flowchart illustrating operation of the thickness calculation function of the semiconductor manufacturing equipment according to Embodiment 7.

FIG. 12 is a flowchart illustrating operation of the thickness calculation function 200 of the semiconductor manufacturing equipment according to Embodiment 7. A wafer is placed on a wafer stage in an etching chamber so that the rear surface is etched. Further, the rotation angle of the wafer stage in the etching chamber is set to the original point.

Similarly to the flowchart shown in FIG. 3, the subflow SF101 is a subflow illustrating operation of the thickness calculation function 200 in the all measurement regions, comprising the step S101 (step of (a) acquiring the measurement value) to the step S104 (step of (d) calculating the representative value of the thickness). First, the thickness measurement function 50 measures the thickness of the wafer before the etching. The thickness measurement function 50 measures the thickness at a plurality of places in the diameter direction on the surface on the wafer rear surface side. For example, in an 8-inch wafer, the thickness is measured at a density of 40,000 pieces/200 mm. In parallel with the thickness measurement, acquisition of the measurement value (step S101: step of (a1) acquiring the measurement value before etching), creation of the histogram (step S102: step of (b) creating histogram data), and extraction of the grade group (step S103: step of (c) extracting a grade group) for the thickness calculation function 200 are processed.

The thickness calculation function 200 calculates a representative value of the thickness of the measurement region before the etching based on the grades included in the extracted grade group (step S104: step of (d) calculating the representative value of the thickness). It should be noted that, in Embodiment 7, the representative value of the thickness of the measurement region represents the representative value based on the grade included in the grade group D1 including the largest grade. More specifically, the thickness calculation function 200 divides the wafer into 49 sections having a width of 4 mm except the edge part 2 mm of the wafer, creates histogram data for each measurement region of each section, and calculates the representative value based on the grades included in the grade group D1 including the largest grade, the thickness calculation function 200 performs this on all measurement regions of all the sections.

Next, the wafer is etched while rotating the wafer (subflow SF102: step of (e) etching). After the etching, the rotation angle of the wafer stage is returned to the original point.

Similarly to the flowchart shown in FIG. 3, the subflow SF103 is a subflow illustrating operation of the thickness calculation function 200 in the all measurement regions, comprising the step S101 (step of (a) acquiring the measurement value) to the step S104 (step of (d) calculating the representative value of the thickness). And, the thickness measurement function 50 measures the thickness of the wafer after the etching. The measurement of the thickness is the same as that before the above described etching, the description thereof is omitted. In parallel with the thickness measurement, acquisition of the measurement value (step S101: step of (a2) acquiring the measurement value after etching), creation of the histogram (step S102: step of (b) creating histogram data), and extraction of the grade group (step S103: step of (c) extracting a grade group) for the thickness calculation function 200 are processed.

And, the thickness calculation function 200 calculates a representative value of the thickness of the measurement region after the etching based on the grades included in the extracted grade group (step S104: step of (d) calculating the representative value of the thickness). The calculation of the representative value is the same as that before the above described etching, the description thereof is omitted.

Next, the etching thickness determination unit 5 compares the representative values of the thickness before and after the etching (subflow SF104). For example, the etching thickness determination unit 5 calculates the difference between the representative values of the thickness before and after the etching for each measurement region of each section. And, with respect to each of the distribution of the representative value of the thickness before the etching, the distribution of the representative value of the thickness after the etching, and the distribution of the difference of the representative value of the thickness, the etching thickness determination unit 5 calculates the maximum value, the minimum value, the average value, standard deviation and the like, and determines whether those values fall within a predetermined range. When these values fall within the predetermined range, the etching thickness determination unit 5 determines that the etching has been performed properly (subflow SF105: step of (f) determining whether the etching has been performed to the predetermined thickness).

It should be noted that, as described in Embodiment 1, in step S104 (step of (d) calculating the representative value of the thickness), the representative value is calculated based on the grades included in the grade group D1 including the largest grade among the extracted grade groups; therefore, the representative value of the thickness of the measurement region on the wafer surface can be obtained without being affected by steps such as a trench formed on the wafer surface.

Effects

For the maximum value, the minimum value, the average value, standard deviation and the like are calculated with respect to each of the distribution of the representative value of the thickness before the etching, the distribution of the representative value of the thickness after the etching, and the distribution of the difference of the representative value of the thickness, and whether those values fall within a predetermined range is determined, thereby management of quality of etching is ensured. Needless to say, etching is prevented from performing on untargeted wafers by performing the determination of the distribution of the representative value of the thickness before the etching (subflow SF102: step of (e) etching).

Embodiment 8

Figure 13:
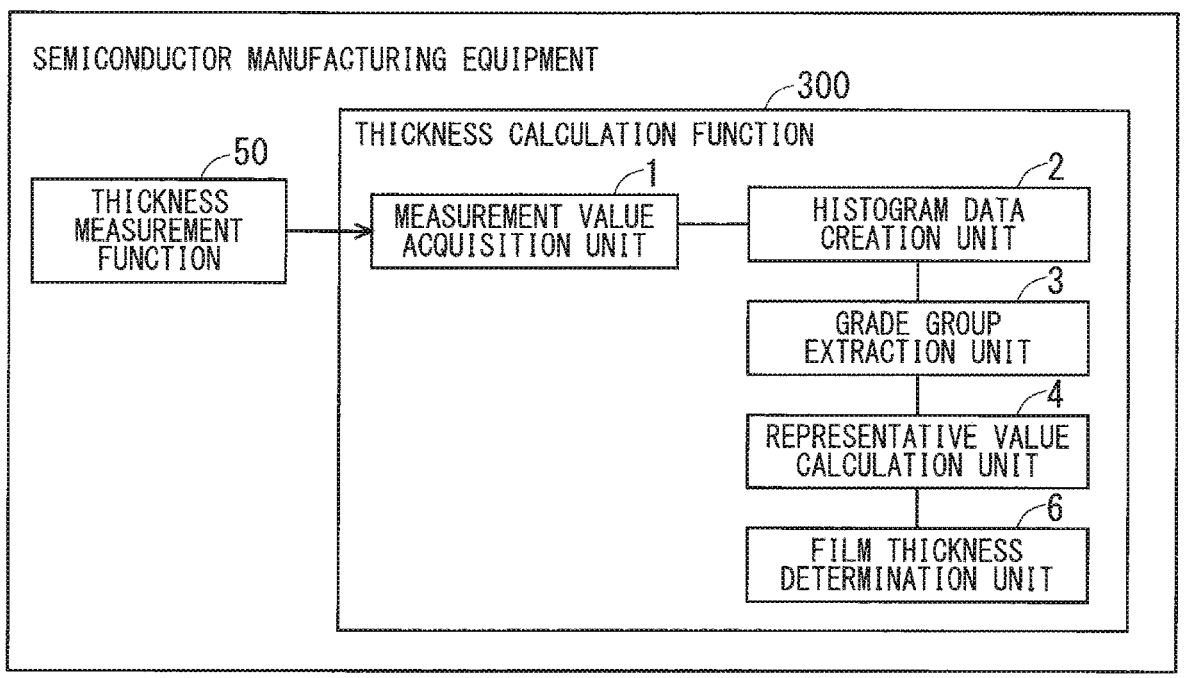
FIG. 13 A block diagram illustrating a configuration of a thickness calculation function of semiconductor manufacturing equipment according to Embodiment 8.

FIG. 13 is a block diagram illustrating a configuration of a thickness calculation function 300 of semiconductor manufacturing equipment according to Embodiment 8. The thickness calculation function 300 according to Embodiment 8 further includes a film thickness determination unit 6 in contrast to the thickness calculation function 100 (FIG. 1). As described later, the film thickness determination unit 6 determines whether a film is deposited to a predetermined thickness based on the representative value of the thickness of the measurement range before and after the film deposition process.

Figure 14:
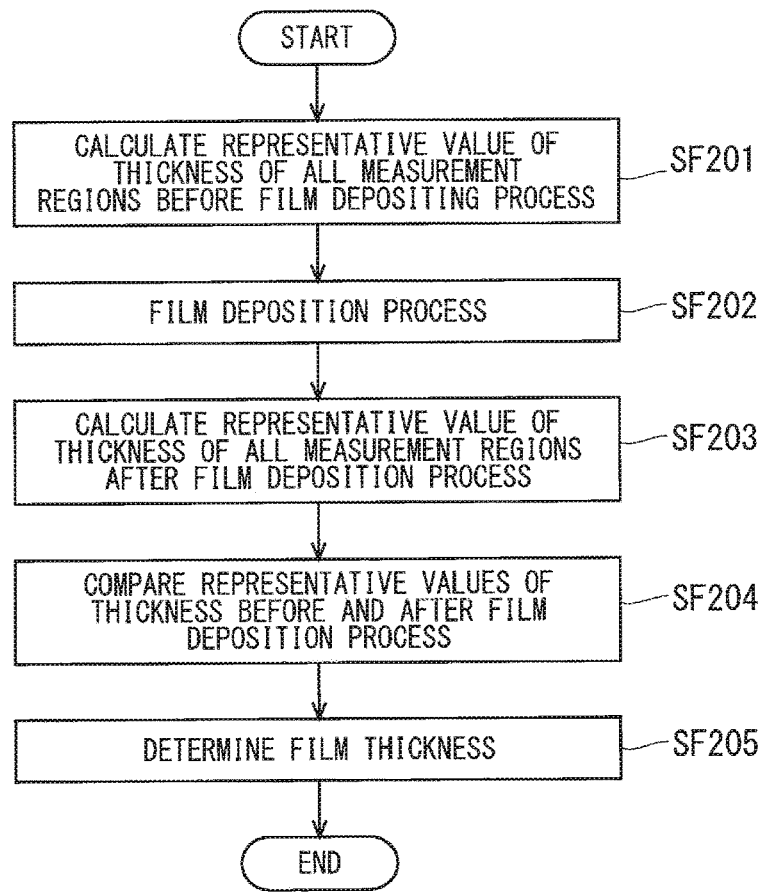
FIG. 14 A flowchart illustrating operation of the thickness calculation function of the semiconductor manufacturing equipment according to Embodiment 1.

FIG. 14 is a flowchart illustrating operation of the thickness calculation function 300 at the time of the film deposition process of the semiconductor manufacturing equipment according to Embodiment 8. The wafer is placed on the wafer stage in the vapor deposition chamber so as to be deposited on the front surface side. Further, the rotation angle of the wafer stage in the vapor deposition chamber is set to the original point.

Similarly to the flowchart shown in FIG. 3, the subflow SF201 is a subflow illustrating operation of the thickness calculation function 300 in the all measurement regions, comprising the step S101 (step of (a) acquiring the measurement value) to the step S104 (step of (d) calculating the representative value of the thickness). First, the thickness measurement function 50 measures the thickness of a film, for example, an Si oxide film on the wafer before the film deposition process. The thickness measurement function 50 measures the thickness at a plurality of places in the rotational direction on the surface on the wafer. For example, in an 8-inch wafer, the thickness is measured at a density of 36,000 pieces/1 rotation. In parallel with the thickness measurement, acquisition of the measurement value (step S101: step of (a3) acquiring the measurement value before film deposition process), creation of the histogram (step S102: step of (b) creating histogram data), and extraction of the grade group (step S103: step of (c) extracting a grade group) for the thickness calculation function 300 are processed.

The thickness calculation function 300 calculates a representative value of the thickness of the measurement region before the film deposition process based on the grades included in the extracted grade group (step S104: step of (d) calculating the representative value of the thickness). It should be noted that, in Embodiment 8, the representative value of the thickness of the measurement region represents the representative value based on the grade included in the grade group D1 including the largest grade. More specifically, the thickness calculation function 300 divides the wafer into 36 sections at ten-degree intervals in the rotational direction, creates histogram data for each measurement region of each section, and calculates the representative value based on the grades included in the grade group D1 including the largest grade, the thickness calculation function 300 performs this on all measurement regions of all the sections.

Next, vapor deposition of, for example, an Si oxide film is performed on the wafer while rotating the wafer (subflow SF202: step of (g) depositing a film). After the film deposition process, the rotation angle of the wafer stage is returned to the original point.

Similarly to the flowchart shown in FIG. 3, the subflow SF203 is a subflow illustrating operation of the thickness calculation function 300 in the all measurement regions, comprising the step S101 (step of (a) acquiring the measurement value) to the step S104 (step of (d) calculating the representative value of the thickness). And, the thickness measurement function 50 measures the thickness of the wafer after the film deposition process. The measurement of the thickness is the same as that before the above described film deposition process, the description thereof is omitted. In parallel with the thickness measurement, acquisition of the measurement value (step S101: step of (a4) acquiring the measurement value after film deposition process), creation of the histogram (step S102: step of (b) creating histogram data), and extraction of the grade group (step S103: step of (c) extracting a grade group) for the thickness calculation function 300 are processed.

And, the thickness calculation function 300 calculates a representative value of the thickness of the measurement region after the film deposition process based on the grades included in the extracted grade group (step S104: step of (d) calculating the representative value of the thickness). The calculation of the representative value is the same as that before the above described film deposition process, the description thereof is omitted.

Next, the film thickness determination unit 6 compares the representative values of the thickness before and after the film deposition process (subflow SF204). For example, the film thickness determination unit 6 calculates the difference between the representative values of the thickness before and after the film deposition process for each measurement region of each section. And, with respect to each of the distribution of the representative value of the thickness before the film deposition process, the distribution of the representative value of the thickness after the film deposition process, and the distribution of the difference of the representative value of the thickness, the film thickness determination unit 6 calculates the maximum value, the minimum value, the average value, standard deviation and the like, and determines whether those values fall within a predetermined range. When these values fall within the predetermined range, the film thickness determination unit 6 determines that the film deposition of, for example, an Si oxide film has been performed properly (subflow SF205: step of (h) determining whether the film deposition has been performed to the predetermined thickness).

It should be noted that, as described in Embodiment 1, in step S104 (step of (d) calculating the representative value of the thickness), the representative value is calculated based on the grades included in the grade group D1 including the largest grade among the extracted grade groups; therefore, the representative value of the thickness of the measurement region on the wafer surface can be obtained without being affected by steps such as a trench formed on the wafer surface.

Effects

For the maximum value, the minimum value, the average value, standard deviation and the like are calculated with respect to each of the distribution of the representative value of the thickness before the film deposition process, the distribution of the representative value of the thickness after the film deposition process, and the distribution of the difference of the representative value of the thickness, and whether those values fall within a predetermined range is determined, thereby management of quality of film depositing is ensured. Needless to say, film deposition is prevented from performing on untargeted wafers by performing the determination of the distribution of the representative value of the thickness before the film deposition (subflow SF202: step of (g) depositing a film).

Meanwhile, in Embodiments 1 to 7, measurement of the thickness of the wafer on which a trench is formed has mainly been described, however, the present invention is not limited thereto, and as described in Embodiment 8, measurement of the thickness of the film deposited on the wafer can also be performed. Further, the wafer is not limited to a silicon wafer, and may be a silicon carbide wafer, a wafer including metal, or the like. Thickness measurement objects include those containing silicon (Si) or silicon (Si), those containing carbon (C) or carbon (C), those containing metal or metal, and the like.

While the invention has been described in detail, the forgoing description is in all aspects illustrative and not restrictive. It is understood that numerous other modifications and variations can be devised departing from the scope of the invention.

The invention claimed is:

1. A semiconductor manufacturing method configured to perform processing for manufacturing a semiconductor on a wafer, the semiconductor manufacturing method comprising a step of
calculating a thickness,
the step of calculating a thickness including the steps of
(a) acquiring a plurality of measurement values at different measurement positions of the wafer from a thickness measurement function configured to measure a thickness of the wafer or a thickness measurement object deposited on the wafer,
(b) creating histogram data based on the plurality of measurement values, and
(c) extracting a grade group from the histogram data the grade group including sequential grades having frequencies equal to or greater than a predetermined frequency,
the step of calculating a thickness including a step of
(d) calculating a representative value of a thickness of a measurement region based on the grades included in the extracted grade group.

2. The semiconductor manufacturing method according to claim 1, wherein,
in the step (d), the representative value is calculated based on the grades included in the grade group including a largest grade.

3. The semiconductor manufacturing method according to claim 1, wherein,
in the step (d), the representative value is calculated based on the grades included in the grade group including a smallest grade.

4. The semiconductor manufacturing method according to claim 1, wherein,
in the step (d), the representative value is calculated based on the grades included in the grade group including a largest grade, and a value obtained by subtracting a predetermined thickness value from the calculated representative value is calculated as a substitute value of the representative value to be calculated based on the grade included in the grade group including a smallest grade.

5. The semiconductor manufacturing method according to claim 1, wherein,
in the step (d), the representative value is calculated based on the grades included in the grade group including a smallest grade, and a value obtained by adding a predetermined thickness value to the calculated representative value is calculated as a substitute value of the representative value to be calculated based on the grade included in the grade group including a largest grade.

6. The semiconductor manufacturing method according to claim 1, wherein,
in the step (d), in the grade group, the representation value is set by dividing a sum of values each obtained by multiplying a median of each grade in the grade group by the frequency of the grade by a sum of the frequencies included in the grade group.

7. The semiconductor manufacturing method according to claim 1, wherein,
in the step (b), in the grade group, an average value of a median of the largest grade and a median of the smallest grade is set as the representative value.

8. The semiconductor manufacturing method according to claim 1, wherein,
in the step (b), in the grade group, a median of the largest grade having a largest frequency is set as the representative value.

9. The semiconductor manufacturing method according to claim 1, wherein,
in the step (d), in the grade group including the largest grade, a median of the grade at the boundary where the frequencies change from increase to decrease from a larger grade side is set as the representative value.

10. The semiconductor manufacturing method according to claim 1, wherein,
in the step (d), in the grade group including the smallest grade, a median of the grade at the boundary where the frequencies change from increase to decrease from a smaller grade side is set as the representative value.

11. The semiconductor manufacturing method according to claim 1, wherein,
in the step (d), the representative value is calculated based on a grade newly set from the largest grade included in the grade group to the smaller grade side, that is included in a grade range that is wide on a grade side smaller than the grade group.

12. The semiconductor manufacturing method according to claim 1, wherein,
in the step (d), the representative value is calculated based on a grade newly set from the smallest grade included in the grade group to the larger grade side, that is included in a grade range that is wide on a grade side larger than the grade group.

13. The semiconductor manufacturing method according to claim 1, wherein,
in the step (d), the representative value is calculated based on a grade newly set from the largest grade included in the grade group to the smaller grade side, that is included in a grade range that is narrow on a grade side smaller than the grade group.

14. The semiconductor manufacturing method according to claim 1, wherein,
in the step (d), the representative value is calculated based on a grade newly set from the smallest grade included in the grade group to the larger grade side, that is included in a grade range that is narrow on a grade side larger than the grade group.

15. The semiconductor manufacturing method according to claim 1, further comprising a step of
(e) etching the thickness measurement object,
wherein the step of calculating a thickness includes a step of,
after the step (e), (f) determining whether the thickness measurement object has been etched to a predetermined thickness,
wherein the step (a) includes the steps of
(a1) acquiring the plurality of measurement values measured on the thickness measurement object before the etching,
(a2) acquiring the plurality of measurement values measured on the thickness measurement object after the etching,
wherein, in the step (d), the representative values of the thickness measurement object for each before and after the etching are calculated based on the grade included in the grade group, and
wherein, in the step (f), whether the thickness measurement object has been etched to a predetermined thickness is determined based on the representative values of the thickness measurement object before and after the etching.

16. The semiconductor manufacturing method according to claim 1, further comprising a step of
(g) depositing the thickness measurement object,
wherein the step of calculating a thickness of the thickness measurement object includes a step of,
after the step (g), (h) determining whether the thickness measurement object has been deposited to a predetermined thickness,
wherein the step (a) includes the steps of
(a3) acquiring the plurality of measurement values measured on the thickness measurement object before film deposition,
(a4) acquiring the plurality of measurement values measured on the thickness measurement object after the film deposition,
wherein, in the step (d), the representative values of the thickness measurement object for each before and after the film deposition process are calculated based on the grade included in the grade group, and
wherein, in the step (f), whether the thickness measurement object has been deposited to a predetermined thickness is determined based on the representative values of the thickness measurement object before and after the film deposition process.

* * * * *